United States Patent
Li et al.

(10) Patent No.: US 7,943,949 B2
(45) Date of Patent: May 17, 2011

(54) III-NITRIDE BASED ON SEMICONDUCTOR DEVICE WITH LOW-RESISTANCE OHMIC CONTACTS

(75) Inventors: Yun Li Li, Tainan (TW); Heng Liu, Sunnyvale, CA (US)

(73) Assignee: BridgeLux, Inc., Livermore, CA (US)

( * ) Notice: Subject to any disclaimer, the term of this patent is extended or adjusted under 35 U.S.C. 154(b) by 0 days.

(21) Appl. No.: 10/936,496

(22) Filed: Sep. 9, 2004

(65) Prior Publication Data

US 2006/0049417 A1    Mar. 9, 2006

(51) Int. Cl.
*H01L 33/02*   (2010.01)
*H01L 33/20*   (2010.01)

(52) U.S. Cl. ............ 257/99; 257/E33.006; 257/E33.065

(58) Field of Classification Search .............. 257/94, 257/95, 96, 97, 103, E33.005, E33.006, E33.065, 257/99, E33.011, E33.062, E33.063, E33.064
See application file for complete search history.

(56) References Cited

U.S. PATENT DOCUMENTS

| | | | |
|---|---|---|---|
| 6,369,403 B1 * | 4/2002 | Holonyak, Jr. ............. | 257/13 |
| 6,949,395 B2 * | 9/2005 | Yoo ............................ | 438/47 |
| 7,049,638 B2 * | 5/2006 | Wu et al. .................... | 257/97 |
| 2003/0077847 A1 * | 4/2003 | Yoo ............................ | 438/22 |
| 2005/0023549 A1 * | 2/2005 | Gardner et al. ............ | 257/99 |
| 2005/0236636 A1 * | 10/2005 | Hon et al. ................. | 257/99 |

FOREIGN PATENT DOCUMENTS

JP          10-215034        *  8/1998

OTHER PUBLICATIONS

"Exibit 1" Exciton binding energy vs. Energy Gap. Found by googling "bandgap energy III-V". Retreived on Apr. 27, 2007 from http://www.tf.uni-kiel.de/matwis/amat/semi_en/kap_5/illustr/exciton_bandgap.gif.*

"Exibit 2" Bandgap energy and lattice constant of varoius III-V semiconductors. Found by googling "bandgap energy III-V". Retreived on Apr. 27, 2007 from http://www.ecse.rpi.edu/~schubert/Light-Emitting-Diodes-dot-org/chap12/F12-06%20III-V%20bandgap%20energie.jpg.*

* cited by examiner

*Primary Examiner* — Lynne A Gurley
*Assistant Examiner* — Andrew O Arena
(74) *Attorney, Agent, or Firm* — Albert Harnois

(57) ABSTRACT

The present invention utilizes high-indium-content $In_xGa_{1-x}N$ islands ($0 < x \leq 1$) formed on a top of a p-type GaN based layer to reduce contact resistance between an electrode and the p-type GaN based layer. These $In_xGa_{1-x}N$ islands serve as channels for electrical current to flow through and dramatically reduce the contact resistance between the electrode and the p-type GaN based layer so as to improve device performance. This structure of $In_xGa_{1-x}N$ islands can be applied to all III-nitride based electronic and optoelectronic devices requiring good p-type ohmic contacts to improve device performance.

17 Claims, 4 Drawing Sheets

III-NITRIDE BASED ON SEMICONDUCTOR DEVICE WITH LOW-RESISTANCE OHMIC CONTACTS

BACKGROUND OF THE INVENTION

1. Field of the Invention

The present invention relates to III-nitride semiconductor devices, and more particularly to III-nitride semiconductor devices with an improved p-contact structure within these devices.

2. Description of the Related Art

III-nitride family is a group of direct-bandgap compound semiconductors composed of group III-A elements in periodic table and nitrogen. This group of material includes binary compounds such as aluminum nitride (AlN), gallium nitride (GaN), indium nitride (InN), ternary compounds such as AlGaN, InGaN, InAlN, as well as quaternary compounds $Al_xIn_yGa_{1-y}N$. III-nitrides have attracted a lot of attention lately due to wide coverage of energy gaps ($E_g$), ranging from 0.8 eV (InN) to 6.2 eV (AlN). Light emitting devices made from III-nitride material can therefore emit light with wavelength covering the whole visible spectrum. Nitride-based green, blue and ultra-violet (UV) light emitting diodes are now commercially available and are applied to applications such as displays, indicator lights, traffic lights and even illumination light sources. Nitride-based laser diodes (LDs) were also commercialized and utilized in new generation digital video disk (DVD) system with much higher storage capacity. In addition, with high mechanical and temperature stabilities, III-nitride materials are very suitable for fabricating high power electronic devices. The supreme material properties have made this material system an attractive candidate for future optoelectronics devices.

In almost all semiconductor devices, low-resistance ohmic contacts are required for optimum device performance. High-resistance contact degrades device performance during operation due to excessive heat generated at the contact interface with the semi-conducting material. This issue is particularly important to III-nitride materials since the large energy bandgaps make it difficult to obtain as good ohmic contacts as in other III-V compounds with smaller bandgaps such as GaAs and InP. Thus, fabricating low-resistance ohmic contacts has been one of the major research topics in III-nitride based electronic and optoelectronic devices. In the past few years, progress has been made with good ohmic contacts achieved on both n- and P-type GaN and AlGaN. Ohmic metal contacts to N-type III-nitrides can be obtained using Ti/Al etc. However, due to the large acceptor (mainly Mg) activation energy and the lack of metals with large enough work function, only limited success has been reported for P-type III-nitrides. So far, Ni/Au, Pd/Au and Ag have demonstrated acceptable ohmic contact to Mg doped P-type III-nitride materials. However, to achieve higher device performance, an even more improved P-type contact is still needed.

III-nitride materials are known to exhibit strong polarization effect. Strong piezoelectric polarization often exists in layered structure. By taking advantage of this effect, a novel approach to form good metal-semiconductor ohmic contacts was realized. With appropriate polarization, the thickness of the Schottky barrier at the metal-semiconductor interface can be decreased, and therefore increasing the carrier tunneling probability. Such polarization-enhanced ohmic contacts to P-type III-nitride can be made by depositing a compressively strained capping layer on a relaxed buffer layer. Examples of such structures are a strained thin GaN layer deposited on the relaxed thick AlGaN layer or a strained thin InGaN layer deposited on the relaxed thick GaN layer.

In reality, however, it is not easy to fabricate such structures, especially for depositing InGaN layer on GaN layer due to the large lattice mismatch between InGaN and GaN.

Additionally, if the bandgap of the InGaN layer is smaller than the bandgap of the light generation layer of a light emitting device, the InGaN layer can be light absorbing and reduces the light output efficiency of the device. In the case of short wavelength light emitting diode in the 400 nm range, the large absorption coefficient of InGaN material at this wavelength can make the light emitting device utilizing the InGaN capping layer very inefficient.

Accordingly, it is an intention to provide a III-nitride semiconductor device with an improved P-type contact structure to overcome the above drawbacks encountered in the prior III-nitride semiconductor devices.

SUMMARY OF THE INVENTION

One objective of the present invention is to provide a III-nitride semiconductor device with low-resistance ohmic contacts to improve device performance.

Another objective of the present invention is to provide a good P-type ohmic contact for III-nitride semiconductor device for improving device performance.

Still another objective of the present invention is to provide a structure of high-indium-content $In_xGa_{1-x}N$ islands ($0<x\leq1$) on a top of a P-type III-nitride semiconductor layer to reduce contact resistance between an electrode and the P-type III-nitride semiconductor layer to improve device performance.

The present invention utilizes high-indium-content $In_xGa_{1-x}N$ islands ($0<x\leq1$) formed on a top of a P-type III-nitride semiconductor layer to reduce contact resistance between an electrode and the P-type III-nitride semiconductor layer. This structure of high-indium-content $In_xGa_{1-x}N$ islands ($0<x\leq1$) can be applied to all III-nitride based electronic and optoelectronic devices requiring good P-type ohmic contacts for improving device performance. These high-indium-content $In_xGa_{1-x}N$ islands ($0<x\leq1$) are grown pseudomorphically on the top of the P-type III-nitride based semiconductor layer and are preferably compressively strained. Due to the strong internal polarization field, the carrier tunneling probability between the contact electrode and these strained $In_xGa_{1-x}N$ islands ($0<x\leq1$) is enhanced. These islands serve as channels for electrical current to flow through and dramatically reduce the contact resistance between the electrode and the P-type III-nitride based semiconductor layer. Further, since InGaN material tends to grow away from crystal defects such as dislocations, these $In_xGa_{1-x}N$ islands ($0<x\leq1$) would be away from dislocations so that electrical current does not flow through these defective regions, avoiding loss of carriers. On the other hand, for light emitting devices, the $In_xGa_{1-x}N$ islands ($0<x\leq1$) would serve as scattering centers and create diffractive effect of the light transmitted through the top surface of the III-nitride based semiconductor device, facilitating light being extracted from the device.

The objectives and characteristics of the present invention as stated above are further described in detail based on the drawings shown below. However, it should be noted that the drawings and the preferred embodiments referred to herein are merely for the purpose of detailed description, and therefore, do not confine or limit the present invention.

DETAILED DESCRIPTION OF THE INVENTION

Recent research has shown that a wurtzite structure of III-nitride semiconductor material system with [0001] growth direction (Ga-face) or [000$\bar{1}$] growth direction (N-face), leads to the existence of a strong spontaneous polarization, and a large internal electrical field is induced by this strong polarization. The existence of nonzero spontaneous polarization is a consequence of lacking centro-symmetry along [0001] direction (c-axis) in the wurtzite crystal structure. The strong spontaneous polarization is inherent to the III-nitride wurtzite crystal structure and the direction of the spontaneous polarization field depends upon the growth direction of the material.

On the other hand, strong piezoelectric polarization in III-nitride heterostructures is induced as well due to the strain of the wurtzite crystal. It has been shown that an epitaxial layer can be grown pseudomorphically on a substrate with a slightly different lattice constant if the thickness of the grown layer is within the critical thickness. A semiconductor layer is strained if it is grown pseudomorphically on a substrate with a different lattice constant. Thus, when a heterostructure of GaN alloyed with Al and In is grown pseudomorphically (e.g. an AlGaN capping layer on a GaN buffer layer or a GaInN capping layer on a GaN buffer layer) as shown in FIG. 1(b) and FIG. 1(c), respectively, a large piezoelectric field is induced within this structure due to the strain of the capping layer.

Due to the strong spontaneous and piezoelectric polarization in III-nitride heterostructures, it has been shown that this material system exhibits very large internal electric fields. It is found that the electric field induced by spontaneous polarization is approximately as strong as the piezoelectric polarization in strained AlGaN/GaN (GaInN/GaN) heterostructures.

Figure 1C:
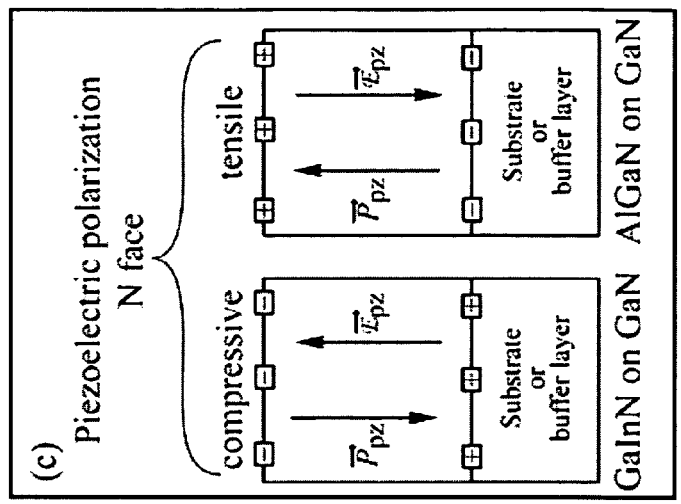
FIGS. 1(a)-1(c) depict schematic diagrams of polarization, electric field and interfacial bound charges caused by spontaneous and piezoelectric polarization effects in III-nitride heterostructures.
Figure 1B:
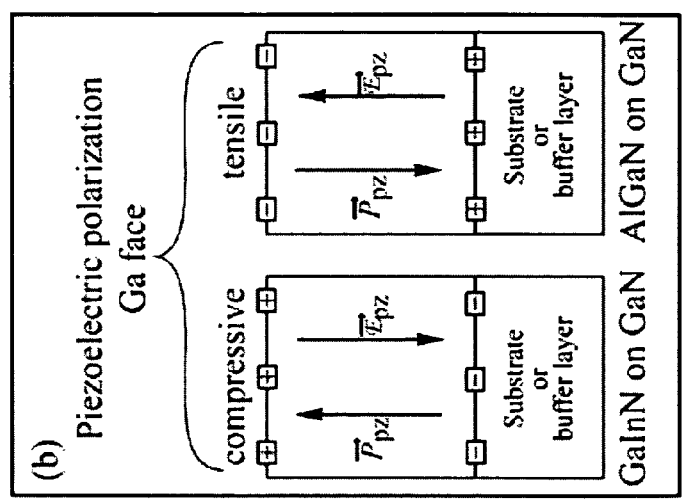
Figure 1A:
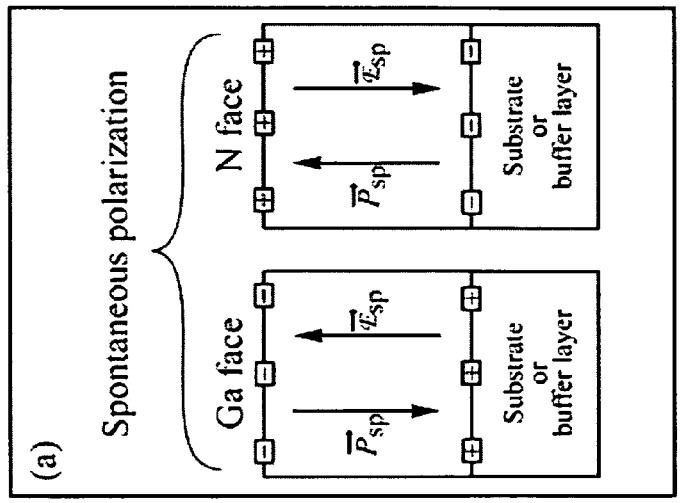

The direction of the polarization, the internal electric field, and induced bound charge polarity are schematically shown in FIG. 1(a) to FIG. 1(c). Inspection of the figures reveals that a desired polarization direction can be designed into a structure by an appropriately choosing of the device structure parameters (strain, layer thickness, composition, etc.) and material parameters (growth face, choice of substrate, substrate orientation, etc.).

Figure 2A:
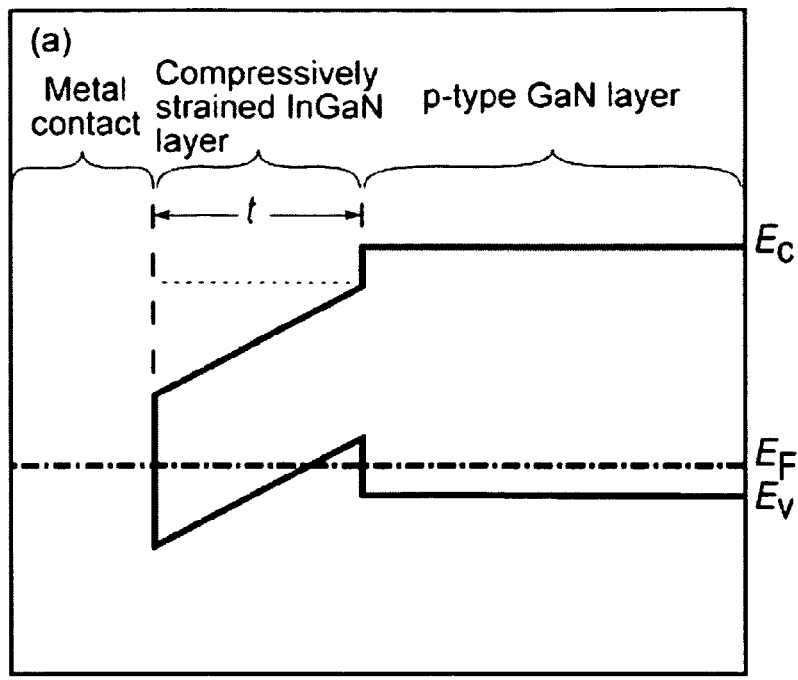
FIG. 2(a) depicts schematic band diagram of InGaN/GaN structure with polarization effect.
Figure 2B:
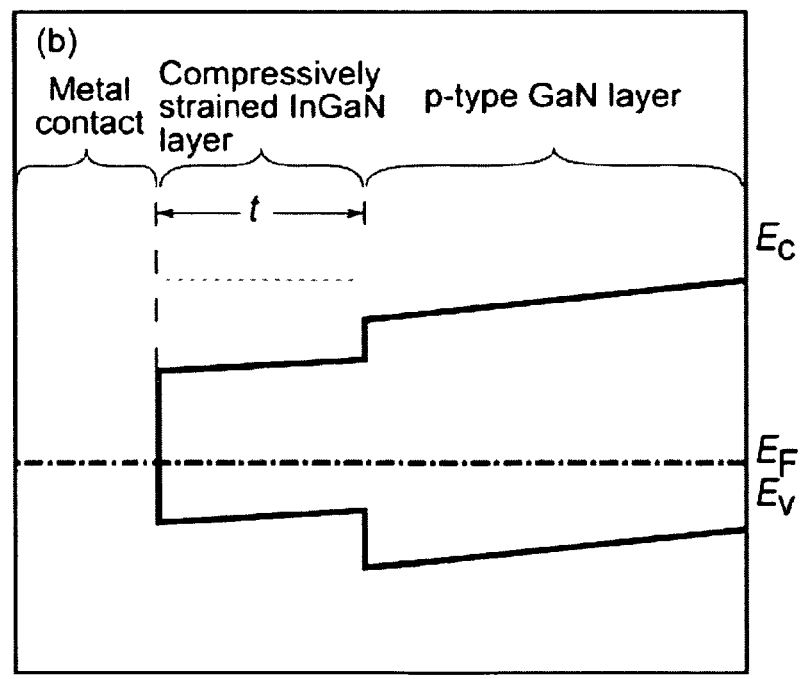
FIG. 2(b) depicts schematic band diagram of InGaN/GaN structure without polarization effect.

Because of the internal polarization field, it is found that the InGaN thin film grown on the top of the P-typeGaN layer would result in a band-bending as shown in FIG. 2(a). The band diagram of a same structure without considering polarization effects is shown in FIG. 2(b) as a comparison. Under certain conditions, the quantum mechanical tunneling would become the dominant mechanism of the carrier transport at the contact interface. In the case of a structure with strong polarization effects, the thickness t of this InGaN capping layer can be thought as the tunneling length for carriers to tunnel from electrode into semiconductor as shown in FIG. 2(a). However, the tunneling length for the same structure without polarization effects is much longer than t as shown in FIG. 2(b). According to quantum mechanics, tunneling probability increases with the decrease of tunneling length. Thus, the tunneling probability is larger for a capping layer with strong internal polarization effects and the contact resistance can be reduced.

On the other hand, the tunneling probability can be even more enhanced with higher indium concentration within the InGaN thin film since stronger electric field makes the tunneling length even shorter. In order to optimize the contact resistance utilizing polarization effect, a compressively strained thin InGaN layer with high indium contents is therefore needed.

However, to fabricate a thin, uniform and high-indium-content InGaN thin film as a capping layer on the GaN layer is very challenging due to the thermodynamically instability of InGaN material. It is well known that indium tends to segregate during the growth of InGaN. Nano-sized InGaN islands with high indium contents can be formed during the growth of InGaN under certain growth conditions. It was also observed that these InGaN islands grown pseudomorphically to the GaN layer have a tendency to form away from threading dislocation sites.

Figure 3A:
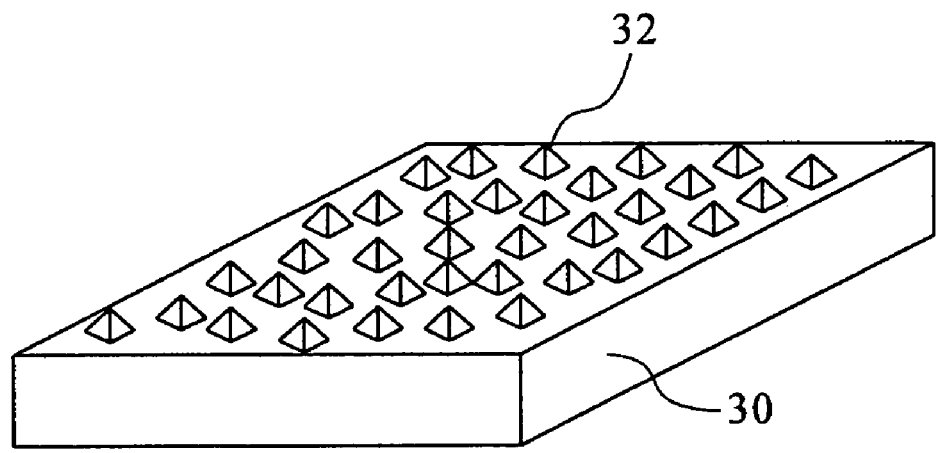
FIGS. 3(a)-3(b) show schematic perspective views of various stages of a method for fabricating a GaN based semiconductor device according to one preferred embodiment of the present invention.
Figure 3B:
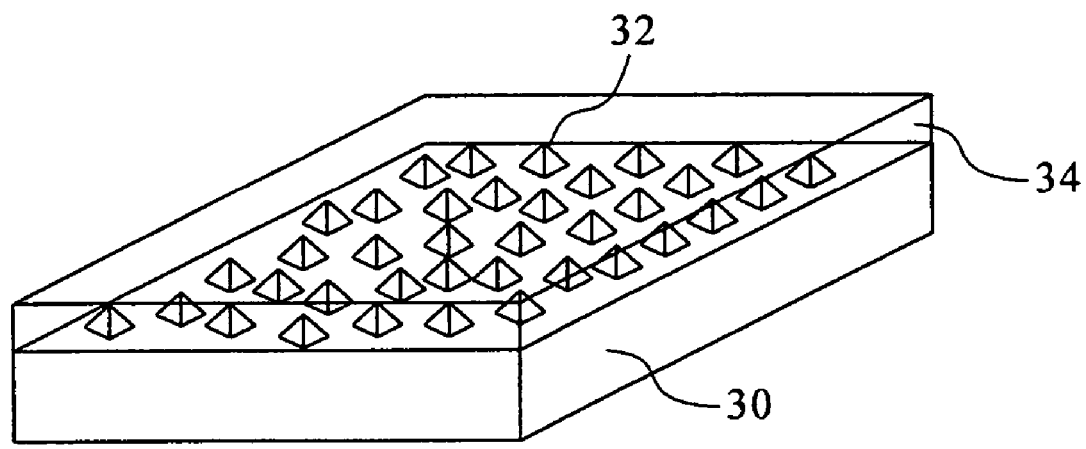

The present invention is to take advantage of both the large internal polarization field and the nano-sized $In_xGa_{1-x}N$ islands with high indium contents to facilitate ohmic contact to the P-typeGaN based material. FIGS. 3(a) to 3(b) depict schematic perspective views of various stages of a method for fabricating a GaN based semiconductor device according to one preferred embodiment of the present invention. Referring to FIG. 3(a), a compressively strained $In_xGa_{1-x}N$ layer ($0<x\leq1$) is pseudomorphically grown on a top of a P-typeGaN based layer 30 to form nano-sized $In_xGa_{1-x}N$ islands 32. In other words, the nano-sized $In_xGa_{1-x}N$ islands 32 are directly grown on the top of the P-typeGaN based layer 30, i.e. the nano-sized $In_xGa_{1-x}N$ islands 32 are in physical contact with the P-typeGaN based layer 30. In the present invention, the nano-sized $In_xGa_{1-x}N$ islands 32 can be formed on the top of the P-typeGaN based layer 30 by an organometallic chemical vapor deposition method (OMCVD). The coverage of the nano-sized $In_xGa_{1-x}N$ islands 32 can range from 10% to 100% of the P-typeGaN based layer 30. And, the nano-sized $In_xGa_{1-x}N$ islands 32 have lateral sizes between 1 nm to 200 nm and vertical sizes between 0.5 nm to 10 nm. The GaN based layer 30 is formed on a substrate (not shown), such as sapphire ($Al_2O_3$), SiC, ZnO, Si, GaP, GaAs, or any other suitable material. In the present invention, the GaN based layer 30 includes GaN, AlN, AlGaN, InGaN and AlInGaN. Referring to FIG. 3(b), after the growth of the nano-sized $In_xGa_{1-x}N$ islands 32, an electrode 34 served as ohmic contact is deposited on the top of these nano-sized $In_xGa_{1-x}N$ islands 32. The electrode 34 can be a metal layer including at least one metal selected from a group consisting of Ni, Au, Al, Ti, Pt, Pd, Ag, Tl and Cu. Alternately, the electrode 34 can include at least one alloy selected from a group consisting of Ni/Au, Pd/Au, Tl/Au and Cu/Au. Besides, the electrode 34 can include at least one layer of conductive transparent oxide including at least one of In, Sn, Cd and Zn. Each $In_xGa_{1-x}N$ island 32 can be treated as a conducting channel between the electrode 34 and the P-typeGaN based layer 30. Because of the low contact resistance at the interface between $In_xGa_{1-x}N$ islands 32 and the P-typeGaN based layer 30, high quality ohmic contact is realized. At the same time, since these $In_xGa_{1-x}N$ islands tend to stay away from the dislocation sites, electrical current leak through these dislocations can be reduced, avoiding excessive loss of carriers.

Figure 4:
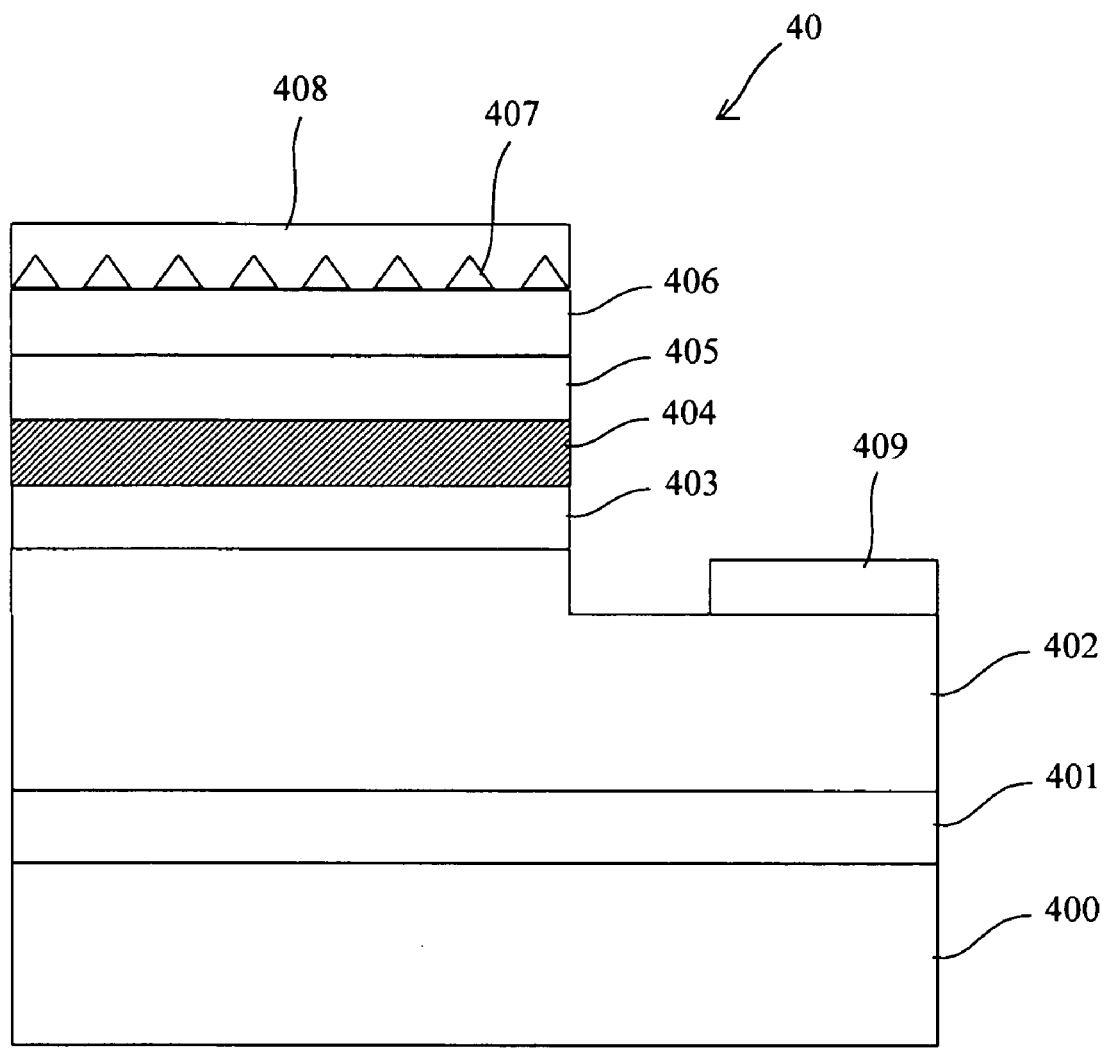
FIG. 4 shows a schematic cross-sectional view of a light emitting diode with compressively strained high-indium-content $In_xGa_{1-x}N$ islands on a top of a P-type GaN based layer thereof.

The structure of high-indium-content $In_xGa_{1-x}N$ islands ($0<x\leq1$) of the present invention can be applied to all III-nitride based electronic and optoelectronic devices requiring good P-type ohmic contacts, such as light emitting diode, laser diode and transistor, etc. FIG. 4 is an application of the present invention, showing a schematic cross-sectional view of a light emitting diode 40. The light emitting diode 40 is formed on a substrate 400, such as an $Al_2O_3$ substrate. A nucleation layer 401 and an N-type conductive buffer layer 402 are sequentially formed over the substrate 400. The buffer layer 402 includes GaN doped with N-type dopant, so as to ease the crystal growth for the subsequent crystal growing process. A light-emitting active layer 404 is formed over the buffer layer 402. The active layer 404 is confined by confinement layers, that is, lower cladding layer 403 and higher cladding layer 405. The lower cladding layer 403 and higher cladding layer 405 are doped with opposite conductive types. For example, if the lower cladding layer 403 is the GaN layer doped with N-type dopants, the upper cladding layer 20 is the GaN layer doped with P-type dopants. Then, a P-type contact layer 406 is formed on the upper cladding layer 405. The P-type contact layer 406 is a P-type GaN based layer. Thereafter, $In_xGa_{1-x}N$ islands ($0<x\leq1$) 407 are formed on the P-type GaN based layer 406. The $In_xGa_{1-x}N$ islands 407 are under compressive strain to the P-type GaN based layer 406. A transparent electrode layer 408 is then formed on the $In_xGa_{1-x}N$ islands 407 to serve as an anode of the diode. Moreover, an electrode layer 409, serving as a cathode of the diode, is also formed on the buffer layer 402 but is separated from the lower and higher cladding layers 403 and 406, and the active layer 404.

These embodiments are only used to illustrate the present invention, and are not intended to limit the scope thereof. Many modifications of the embodiments can be made without departing from the spirit of the present invention.

What is claimed is:

1. A GaN based semiconductor device, comprising:
   a P-type GaN based layer;
   a structure of compressively strained $In_xGa_{1-x}N$ islands directly formed on a Ga-face of said P-type GaN based layer, wherein $0<x\leq1$; and
   an electrode formed directly on said compressively strained $In_xGa_{1-x}N$ island.

2. The GaN based semiconductor device as claimed in claim 1, wherein said compressively strained $In_xGa_{1-x}N$ islands are nano-sized $In_xGa_{1-x}N$ islands.

3. The GaN based semiconductor device as claimed in claim 2, wherein said $In_xGa_{1-x}N$ islands have lateral sizes between 1 nm to 200 nm.

4. The GaN based semiconductor device as claimed in claim 3, wherein said $In_xGa_{1-x}N$ islands have vertical sizes between 0.5 nm to 10 nm.

5. The GaN based semiconductor device as claimed in claim 2, wherein said $In_xGa_{1-x}N$ islands have vertical sizes between 0.5 nm to 10 nm.

6. The GaN based semiconductor device as claimed in claim 1, wherein said GaN based semiconductor device includes a light emitting diode, a laser diode or a transistor.

7. The GaN based semiconductor device as claimed in claim 1, wherein said P-type GaN based layer includes GaN, AlN, AlGaN, InGaN or AlInGaN.

8. The GaN based semiconductor device as claimed in claim 1, wherein said electrode comprises at least one metal selected from a group consisting of Ni, Au, Al, Ti, Pt, Pd, Ag, Tl and Cu.

9. The GaN based semiconductor device as claimed in claim 1, wherein said electrode comprises at least one alloy selected from a group consisting of Ni/Au, Pd/Au, Tl/Au and Cu/Au.

10. The GaN based semiconductor device as claimed in claim 1, wherein said electrode comprises at least one layer of conductive transparent oxide including at least one of In, Sn, Cd and Zn.

11. A The GaN based semiconductor device as claimed in claim 1, wherein said structure of compressively strained $In_xGa_{1-x}N$ islands comprises a structure of compressively strained high-indium-content $IN_xGa_{1-x}N$ islands.

12. A method for fabricating a GaN based semiconductor device, comprising:
    forming a P-type GaN based layer over a substrate;
    forming a structure of compressively strained $In_xGa_{1-x}N$ islands directly on a Ga-face of said P-type GaN based layer, wherein $0<x\leq1$; and
    forming an electrode directly on said compressively strained $In_xGa_{1-x}N$ islands.

13. The method as claimed in claim 12, wherein said compressively strained $In_xGa_{1-x}N$ islands is pseudomorphically grown on said P-type GaN based layer.

14. The method as claimed in claim 13, wherein said compressively strained $In_xGa_{1-x}N$ islands are formed by an MOCVD (Metal-Organic Chemical Vapor Deposition) method.

15. The method as claimed in claim 12, wherein said P-type GaN based layer includes GaN, AlN, AlGaN, InGaN or AlInGaN.

16. The method as claimed in claim 12, wherein said substrate includes sapphire, SiC, ZnO, Si, GaP or GaAs.

17. The method as claimed in claim 12, wherein said forming a structure of compressively strained $In_xGa_{1-x}N$ islands comprises forming a high-indium-content $IN_xGa_{1-x}N$ islands.

* * * * *